United States Patent
Nakamura et al.

(10) Patent No.: US 7,067,422 B2
(45) Date of Patent: Jun. 27, 2006

(54) METHOD OF FORMING A TANTALUM-CONTAINING GATE ELECTRODE STRUCTURE

(75) Inventors: Kazuhito Nakamura, Yamanashi (JP); Hideaki Yamasaki, Yamanashi (JP); Yumiko Kawano, Yamanashi (JP); Gert J. Leusink, Saltpoint, NY (US); Fenton R. McFeely, Ossinging, NY (US); John J. Yurkas, Stamford, CT (US); Vijay Narayanan, New York, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/830,804

(22) Filed: Mar. 31, 2004

(65) Prior Publication Data

US 2005/0227441 A1    Oct. 13, 2005

(51) Int. Cl.
*H01L 21/44*      (2006.01)
(52) U.S. Cl. ............... 438/656; 438/683; 438/685; 257/E21.17
(58) Field of Classification Search .......... 257/E21.17, 257/E21.171, E21.584
See application file for complete search history.

(56) References Cited

U.S. PATENT DOCUMENTS

| | | | |
|---|---|---|---|
| 6,593,484 B1 * | 7/2003 | Yasuhara et al. | 556/42 |
| 2002/0115886 A1 | 8/2002 | Yasuhara et al. | 562/515 |
| 2002/0192952 A1 * | 12/2002 | Itoh et al. | 438/656 |
| 2003/0008501 A1 | 1/2003 | Bakli et al. | 438/653 |
| 2003/0017697 A1 | 1/2003 | Choi et al. | |
| 2005/0082625 A1 * | 4/2005 | Kim et al. | 257/412 |
| 2005/0104142 A1 * | 5/2005 | Narayanan et al. | 257/412 |

OTHER PUBLICATIONS

Seong Geon Park et al., *Performance Improvement of MOSFET with $HfO_2$-$Al_2O_3$ Laminate Gate Dielectric and CVD-TaN Metal Gate Deposited by TAIMATA*, IEDM Technical Digest, Washington, D.C., Dec. 8, 2003, pp. 327-330.
V. Narayanan et al., *Dual Work Function Metal Gate CMOS Using CVD Metal Electrodes*, VLSI Technology, Digest of Technical Papers, Symposium, Honolulu, HI, Jun. 15, 2004, pp. 192-193.

* cited by examiner

*Primary Examiner*—Trung Dang
(74) *Attorney, Agent, or Firm*—Wood, Herron & Evans, LLP

(57) ABSTRACT

A method for forming a tantalum-containing gate electrode structure by providing a substrate having a high-k dielectric layer thereon in a process chamber and forming a tantalum-containing layer on the high-k dielectric layer in a thermal chemical vapor deposition process by exposing the substrate to a process gas containing TAIMATA ($Ta(N(CH_3)_2)_3(NC(C_2H_5)(CH_3)_2)$) precursor gas. In one embodiment of the invention, the tantalum-containing layer can include a TaSiN layer formed from a process gas containing TAIMATA precursor gas, a silicon containing gas, and optionally a nitrogen-containing gas. In another embodiment of the invention, a TaN layer is formed on the TaSiN layer. The TaN layer can be formed from a process gas containing TAIMATA precursor gas and optionally a nitrogen-containing gas. A computer readable medium executable by a processor to cause a processing system to perform the method and a processing system for forming a tantalum-containing gate electrode structure are also provided.

31 Claims, 9 Drawing Sheets

METHOD OF FORMING A TANTALUM-CONTAINING GATE ELECTRODE STRUCTURE

FIELD OF THE INVENTION

The present invention relates to semiconductor processing, and more particularly to a method of forming a tantalum-containing gate electrode structure.

BACKGROUND OF THE INVENTION

In the semiconductor industry, the minimum feature sizes of microelectronic devices are approaching the deep sub-micron regime to meet the demand for faster, lower power microprocessors and digital circuits. Process development and integration issues are key challenges for new gate stack materials, where the replacement of $SiO_2$ with high-k (where "k" refers to the dielectric constant of the material) dielectric materials can require the use of alternative gate electrode materials to replace doped poly-silicon (poly-Si).

The introduction of metal-containing gate electrodes to replace the traditional poly-Si gate can bring about several advantages. These advantages include elimination of the poly-Si gate depletion effect, reduction in sheet resistance, better reliability and potentially better thermal stability on advanced high-k dielectric gate materials. One of the material selection criteria for the metal-containing gate electrode is that the workfunction be adjustable. Control over the gate workfunction can be achieved using a composite metal-containing layer, where composition of the metal-containing layer can be adjusted to obtain the desired gate workfunction.

SUMMARY OF THE INVENTION

The present invention provides a method of forming a tantalum-containing gate electrode structure having a tantalum-containing layer formed on a substrate having a high-k dielectric layer.

To this end, a substrate having a high-k dielectric layer thereon is provided in a process chamber, a tantalum-containing layer is formed on the high-k dielectric layer in a thermal chemical vapor deposition process by exposing the substrate in the process chamber to a process gas containing TAIMATA (tertiaryamylimido-tris-dimethylamidotantalum, $Ta(N(CH_3)_2)_3(NC(C_2H_5)(CH_3)_2)$ precursor gas.

In one embodiment of the invention, the tantalum-containing layer can include a TaSiN layer. The TaSiN layer can be formed from a process gas containing TAIMATA precursor gas, a silicon containing gas, and optionally a nitrogen-containing gas. In another embodiment of the invention, the tantalum-containing layer can include a TaSiN layer on the high-k dielectric layer and a TaN layer on the TaSiN layer. The TaN layer can be formed from a process gas containing TAIMATA precursor gas and optionally a nitrogen-containing gas.

Also provided are a computer readable medium executable by a processor to cause a processing system to perform the method and a processing system for forming a tantalum-containing gate electrode structure.

DETAILED DESCRIPTION OF THE INVENTION

Figure 1A:
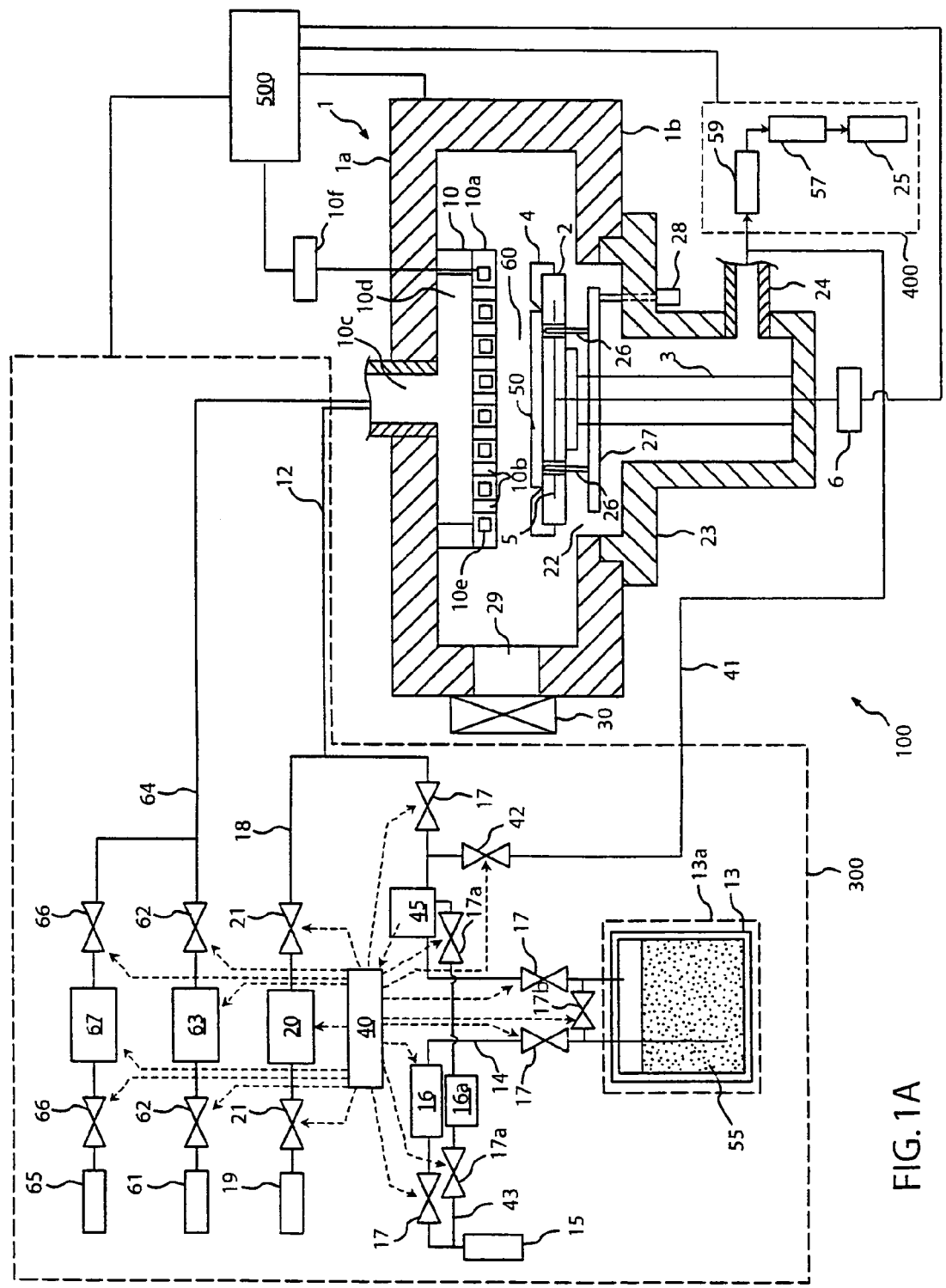
FIG. 1A shows a schematic cross-sectional view of a thermal chemical vapor deposition (TCVD) processing system according to an embodiment of the invention.

FIG. 1 is a simplified block-diagram of a processing system for depositing a tantalum-containing layer according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater or any other type of heater.

The heated substrate 50 can thermally decompose a tantalum-containing precursor gas such as TAIMATA (tertiaryamylimido-tris-dimethylamidotantalum, $Ta(N(CH_3)_2)_3(NC(C_2H_5)(CH_3)_2)$ to form a tantalum-containing layer on the substrate 50. The substrate holder 2 is heated to a predetermined temperature that is suitable for forming the desired tantalum-containing layer onto the substrate 50. A heater (not shown) is embedded in the walls of process chamber 1 to heat the chamber walls to a predetermined temperature. The heater can maintain the temperature of the walls of process chamber 1 from about 40° C. to about 200° C.

A showerhead 10 is located in the upper chamber section 1a of process chamber 1. Showerhead plate 10a at the bottom of showerhead 10 contains multiple gas delivery holes 10b for delivering a process gas comprising the TAIMATA precursor gas into a processing zone 60 located above the substrate 50.

An opening 10c is provided in the upper chamber section 1b for introducing a process gas from gas line 12 into a gas distribution compartment 10d. Concentric coolant flow channels 10e are provided for controlling the temperature of the showerhead 10 and thereby preventing the decomposition of the TAIMATA precursor gas inside the showerhead 10. A coolant fluid such as water, can be supplied to the coolant flow channels 10e from a coolant fluid source 10f for controlling the temperature of showerhead 10 from about 20° C. to about 200° C.

The gas line 12 connects the precursor delivery system 300 to process chamber 1. A precursor container 13 contains a solid TAIMATA precursor 55, and a precursor heater 13a is provided for heating the precursor container 13 to maintain the TAIMATA precursor 55 at a temperature that produces a desired vapor pressure of the TAIMATA precursor. The TAIMATA precursor 55 has a melting point of 36° C. and has a vapor pressure ($P_{vap}$) of 0.1 Torr at 61° C., and 1 Torr at 100° C. Therefore, only moderate heating of the precursor container 13 and the precursor gas delivery lines (e.g., gas line 12) is required for delivering the TAIMATA precursor to the process chamber 1.

In one embodiment of the invention, a carrier gas (e.g., argon (Ar) or helium (He)) can be used to enhance the delivery of the TAIMATA precursor to the process chamber 1. Alternatively, the TAIMATA precursor can be delivered to the process chamber 1 without the use of a carrier gas. Gas line 14 can provide a carrier gas from gas source 15 to the precursor container 13, and a mass flow controller (MFC) 16 and valves 17 can be used to control the carrier gas flow rate. When a carrier gas is used, it may be introduced into the lower part of precursor container 13 so as to bubble through the liquid TAIMATA precursor 55. Alternatively, the carrier gas may be introduced into the precursor container 13 and distributed across the top of the TAIMATA precursor 55. Gas line 14 further contains a bypass valve 17b. A sensor 45 is provided for measuring the total gas flow rate from the precursor container 13. The sensor 45 can, for example, comprise a MFC, and the amount of TAIMATA precursor gas delivered to the process chamber 1 can be determined and controlled using sensor 45 and MFC 16. Alternatively, the sensor 45 can comprise a light absorption sensor to measure the concentration of the TAIMATA precursor in the gas flow to the process chamber 1. In another embodiment of the invention, a liquid delivery system can be used to deliver the TAIMATA precursor gas to the process chamber 1. A bypass line 43 containing valves 17a and MFC 16a is provided for purging the gas line 12 with a carrier gas from gas source 15.

A bypass line 41 is located downstream from sensor 45 and connects gas line 12 to exhaust line 24. Bypass line 41 is provided for evacuating gas line 12 and for stabilizing the supply of the TAIMATA precursor gas to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the TAIMATA precursor in the gas lines. The temperature of the gas lines can be controlled from about 20° C. to about 200° C., or from about 25° C. to about 150° C.

A dilution gas (e.g., Ar or He) can be supplied from gas source 19 to gas line 12 using gas line 18. The dilution gases can be used to dilute the process gas or to adjust the process gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the TAIMATA precursor gas, and a dilution gas. Sensor 45 is also connected to controller 40 and, based on output of the sensor 45, controller 40 can control the carrier gas flow rate through mass flow controller 16 to obtain the desired TAIMATA precursor gas flow rate to the process chamber 1.

Furthermore, a silicon-containing gas can be supplied from gas source 61 to gas line 64 and a nitrogen-containing gas can be supplied from gas source 65 to gas line 64. MFCs 63 and 67, and valves 66 and 62 are controlled by controller 40, which controls the supply, shutoff, and the flow of the silicon-containing gas and the nitrogen-containing gas.

Exhaust line 24 connects exhaust chamber 23 to vacuum pumping system 400. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump. Alternatively, the vacuum pump 25 can include a dry pump. During processing, the process gas can be introduced into the process chamber 1 and the chamber pressure adjusted by the APC 59. The APC 59 can comprise a butterfly-type valve or a gate valve. The trap 57 can collect unreacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below the upper surface of substrate holder 2. A drive mechanism 28 utilizing, for example, an air cylinder provides means for raising and lowering the plate 27. A substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 500 includes a microprocessor, a memory, and a digital I/O port capable of generating control voltages sufficient to communicate and activate inputs of the processing system 100 as well as monitor outputs from the processing system 100. Moreover, the processing system controller 500 is coupled to and exchanges information with process chamber 1, precursor delivery system 300 that includes controller 40 and precursor heater 13a, vacuum pumping system 400, power source 6, and coolant fluid source 10f. In the vacuum pumping system 400, the processing system controller 500 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 500 is a DELL PRECISION WORKSTATION 610™, available from Dell Corporation, Austin, Tex.

Figure 1B:
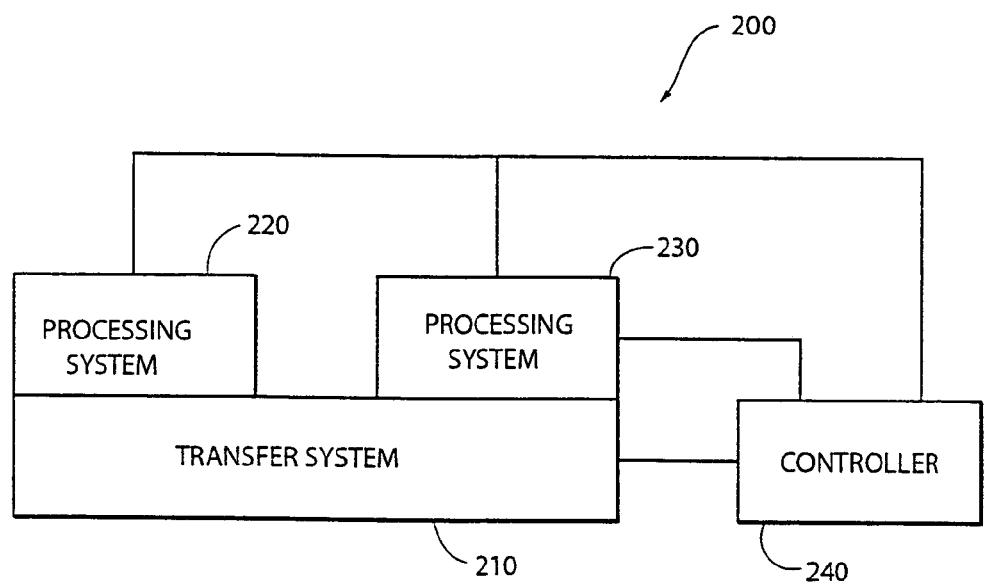
FIG. 1B shows a simplified block diagram of a processing tool according to an embodiment of the invention.

FIG. 1B shows a simplified block diagram of a processing tool according to an embodiment of the invention. The processing tool 200 contains processing systems 220 and 230, a (robotic) transfer system 210 configured for transferring substrates within the processing tool 200, and a controller 240 configured to control the components of the processing tool 200. In another embodiment of the invention, the processing tool 200 can comprise a single processing system or, alternately, can comprise more than two processing systems. In FIG. 2, the processing systems 220 and 230 can, for example, perform at least one of the following processes: form a tantalum-containing layer on a substrate, form a tungsten (W) layer on a substrate, form an interface layer on a substrate, and form a high-k dielectric layer on a substrate. As with the controller 500 in FIG. 1A, the controller 240 may be implemented as a DELL PRECISION WORKSTATION 610™. Moreover, the controller of either FIG. 1A or 1B may be implemented as a general purpose computer system such as that described below with respect to FIG. 8.

Figure 2A:
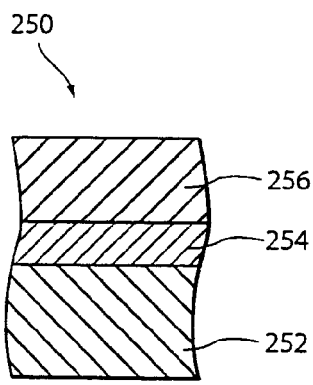
FIGS. 2A–2C schematically show tantalum-containing gate electrode structures according to embodiments of the invention.
Figure 2C:
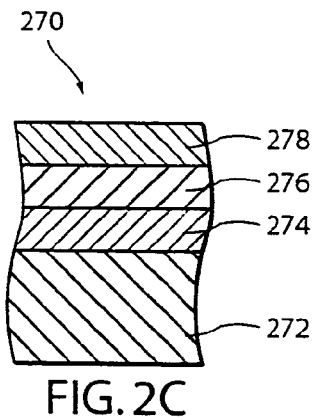
Figure 2B:
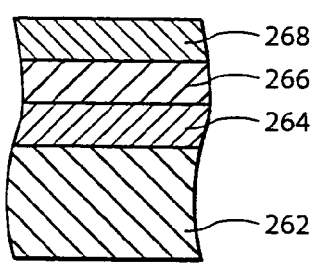

FIGS. 2A–2C schematically show tantalum-containing gate electrode structures according to embodiments of the invention. The tantalum-containing gate electrode structures contain a TaSiN layer on a high-k dielectric layer where the TaSiN layer provides a gate electrode workfunction of about 4.3 eV.

FIG. 2A shows a tantalum-containing gate electrode structure 250 containing a substrate 252. The substrate 252 can be of any size, for example a 200 mm substrate, a 300 mm substrate, or an even larger substrate. The structure 250 further contains a high-k dielectric layer 254 on the substrate 252. The high-k dielectric layer 254 can, for example, contain metallic silicates or oxides such as $Ta_2O_5$ (k~26), $TiO_2$ (k~80), $ZrO_2$ (k~25), $Al_2O_3$ (k~9), HfSiO, and $HfO_2$ (k~25), and can be deposited on the substrate 252 using deposition methods that are well known to artisans skilled in the art.

The gate electrode structure 250 can further contain a thin interfacial layer (not shown) between the substrate 252 and the high-k dielectric layer 254. The interfacial layer can improve the electric properties of the gate electrode structure 250 and can, for example, contain an oxide layer (e.g., $SiO_2$), an oxynitride layer (e.g., SiON), or a nitride layer (e.g., SiN) or a combination of two or more thereof.

The gate electrode structure 250 contains TaSiN layer 256 on the high-k dielectric layer 254. The TaSiN layer 256 can be formed in a thermal chemical vapor deposition (TCVD) process from a process gas containing a TAIMATA precursor gas and a silicon-containing gas. The silicon-containing gas can, for example, contain silane ($SiH_4$), disilane ($Si_2H_6$), dichlorosilane ($SiH_2Cl_2$), hexachlorodisilane ($Si_2Cl_6$), bis(tertbutylamino) silane ($SiH_2(NBu^t)_2$), or tetrakis (dimethylamino) silane ($Si(NMe_2)_4$) or a combination of two or more thereof. The process gas can furthermore contain a nitrogen-containing gas, such as ammonia ($NH_3$), hydrogen gas ($H_2$), a carrier gas, and/or a dilution gas, and the carrier and dilution gases can be an inert gas such as Ar or He.

The process gas flow rate into the processing chamber 1 can be less than about 2,000 standard cubic centimeters per min (sccm). In the precursor delivery system 300, the carrier gas flow rate can be less than about 1,000, the dilution gas flow rate can be less than about 1,000 sccm, the nitrogen-containing gas flow rate can be less than about 1,000 sccm, and the silicon-containing gas flow rate can be less than about 500 sccm. The chamber pressure can be between about 1 mTorr and about 1,000 mTorr, and more preferably between about 10 mTorr and about 200 mTorr. In one embodiment of the invention, the substrate temperature can between about 250° C. and about 750° C. In another embodiment of the invention, the substrate temperature can be between about 400° C. and about 600° C.

FIG. 2B shows a tantalum-containing gate electrode structure according to another embodiment of the invention. In addition to a substrate 262, a high-k dielectric layer 264 on the substrate 262, and a TaSiN layer 266 on the high-k dielectric layer 264, the gate electrode structure 260 contains a tungsten (W) layer 268 on the TaSiN layer 266. The W layer 268 can reduce oxidation of the TaSiN layer 266 and can, for example, be formed in a TCVD process using a process gas containing tungsten hexacarbonyl ($W(CO)_6$) or a tungsten halide (e.g., tungsten hexafluoride ($WF_6$) or tungsten hexachloride ($WCl_6$)) in the presence of a reducing gas, such as hydrogen ($H_2$) or silane ($SiH_4$).

FIG. 2C shows a tantalum-containing gate electrode structure according to yet another embodiment of the invention. In addition to a substrate 272, a high-k dielectric layer 274 on the substrate 272, and a TaSiN layer 276 on the high-k dielectric layer 274, the gate electrode structure 270 contains a TaN layer 278 on the TaSiN layer 276. The TaN layer 278 can be formed in a TCVD process using a process gas containing TAIMATA precursor gas. The process gas can further contain a nitrogen-containing gas such as ammonia ($NH_3$).

Figure 3B:
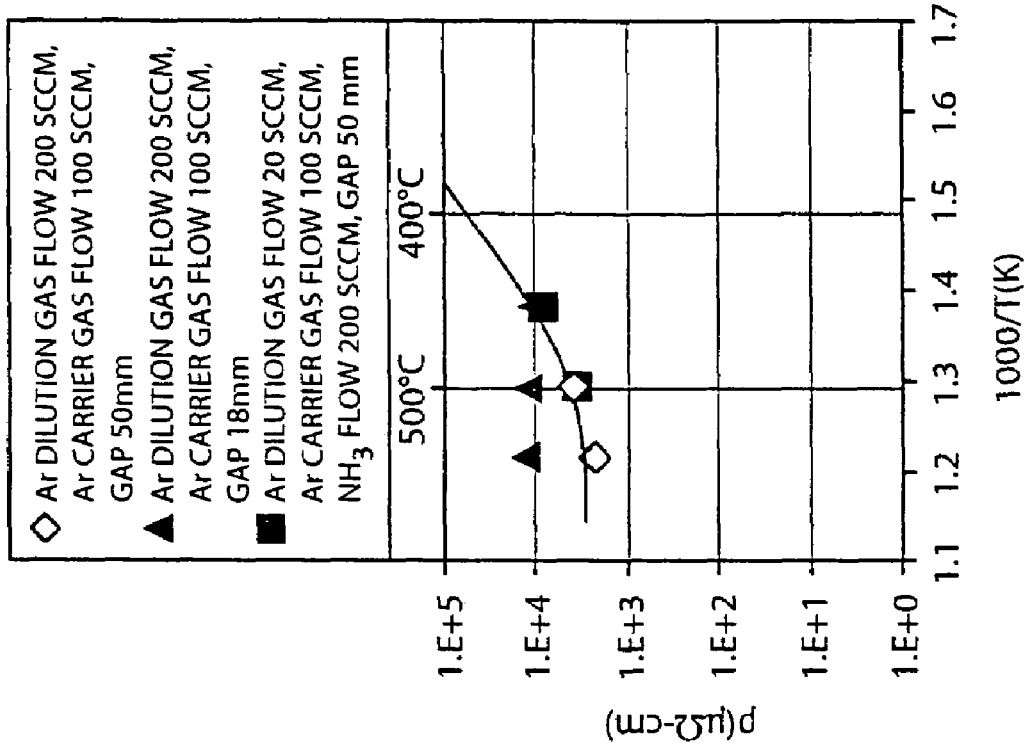
FIGS. 3A–3B show formation of TaN layers from a process gas containing TAIMATA precursor gas according to embodiments of the invention.
Figure 3A:
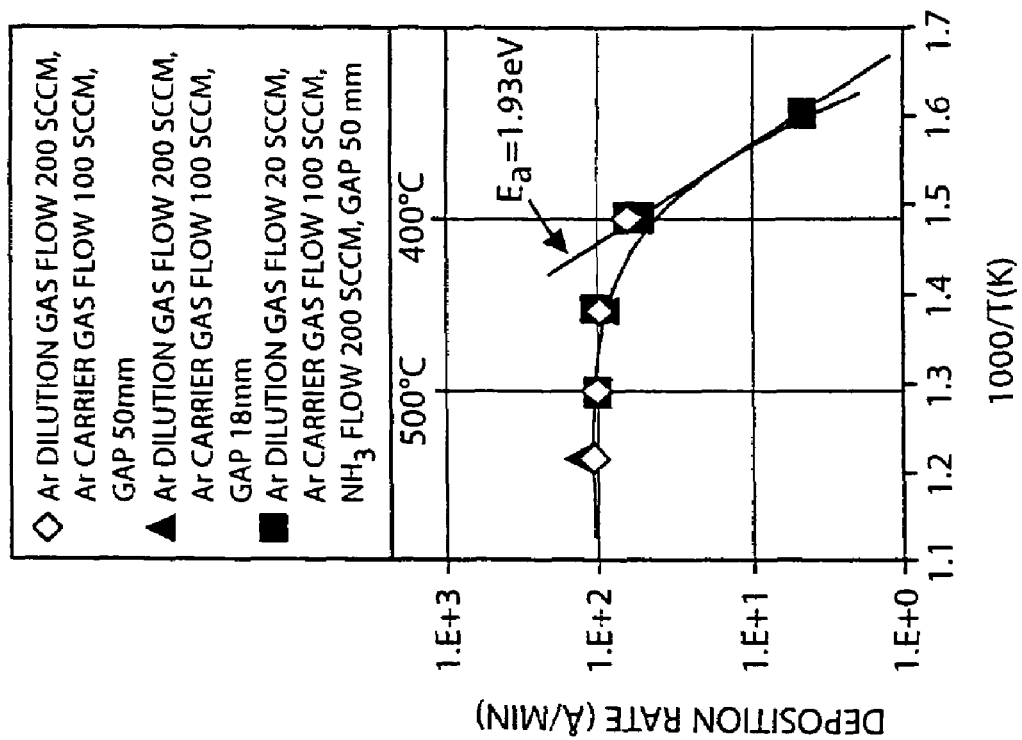

FIGS. 3A–3B show formation of TaN layers from a process gas containing TAIMATA precursor gas according to embodiments of the invention. FIG. 3A shows the deposition rate of TaN layers as a function of substrate temperature. The pressure in the process chamber was 0.05 Torr during formation of the TaN layers. The activation energy ($E_a$) for TaN deposition from TAIMATA was 1.97 eV and the TaN deposition rate saturated at about 100 angstroms (Å)/min. In the current invention, TaN and TaSiN deposition rates were calculated from cross-sectional scanning electron micrographs (SEM). FIG. 3B shows the volume resistivity ($\rho$) of the TaN layers as a function of substrate temperature. The volume resistivity ranged from about 3,000 $\mu\Omega$-cm to about 10,000 $\mu\Omega$-cm, measured by a four point probe. In the figure captions for FIGS. 3A and 3B and in the subsequent description, "gap" refers to the distance between the bottom of the showerhead 10 and the substrate holder 2 in FIG. 1 during deposition of a tantalum-containing layer.

Figure 4B:
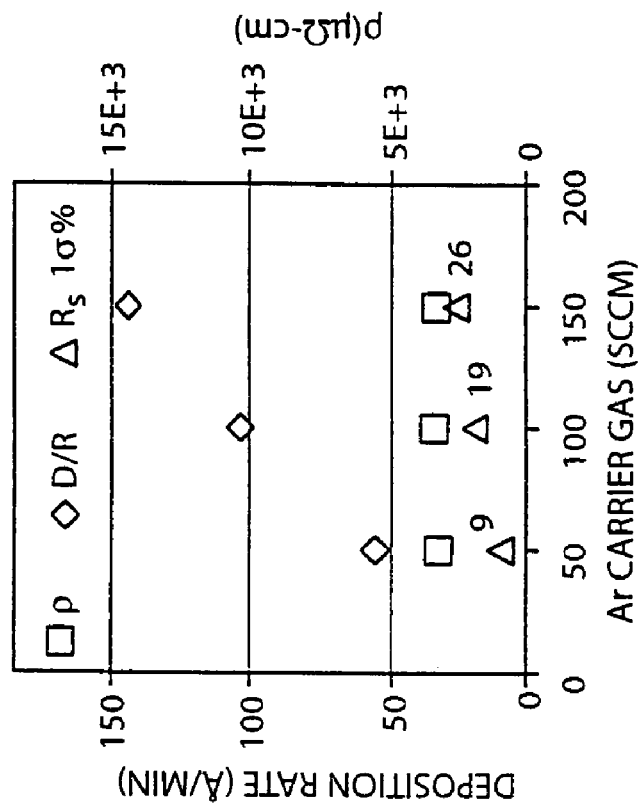
FIGS. 4A–4B show formation of TaN layers from a process gas containing TAIMATA precursor gas according to embodiments of the invention.
Figure 4A:
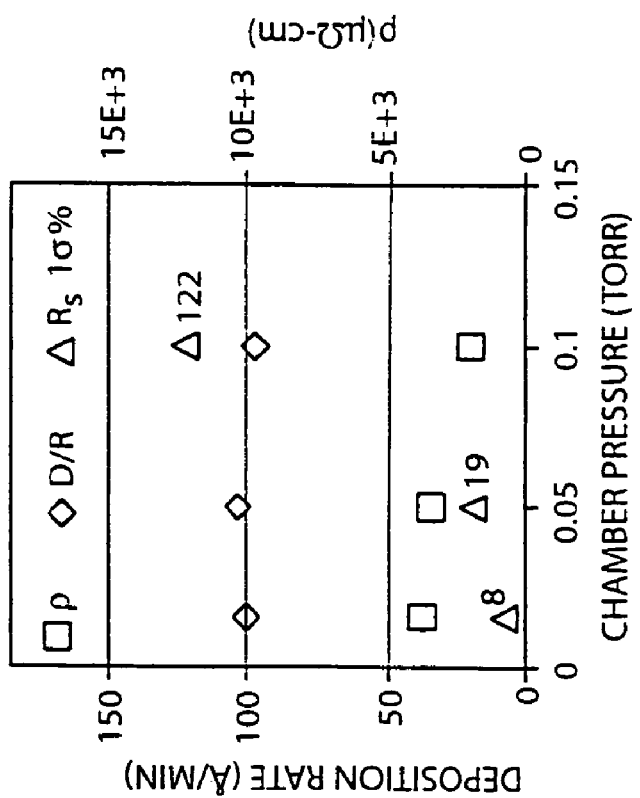

FIGS. 4A–4B show formation of TaN layers from a process gas containing TAIMATA precursor gas according to embodiments of the invention. FIG. 4A is a graph showing deposition rate (D/R), sheet resistance uniformity ($R_s$), and volume resistivity ($\rho$) of the TaN layers as a function of chamber pressure. The substrate temperature was 500° C., the Ar dilution gas flow rate was 200 sccm, the Ar carrier gas flow rate was 100 sccm, and the gap was 50 mm. As the pressure was increased from about 0.015 Torr to 0.10 Torr, the deposition rate (D/R) remained about 100 Å/min, the sheet resistance uniformity ($R_s$% 1$\sigma$) increased from 8% to 122% (see values next to sheet resistance uniformity symbols $\Delta$), and the volume resistivity decreased from about 4,000 $\mu\Omega$-cm to about 2,000 $\mu\Omega$-cm, respectively.

FIG. 4B is a graph showing deposition rate (D/R), sheet resistance uniformity ($R_s$), and volume resistivity ($\rho$) of TaN layers as a function of Ar carrier gas flow rate. The substrate temperature was 500° C., the chamber pressure was 0.05 Torr, the Ar dilution gas flow rate was 200 sccm, the $NH_3$ flow rate was 200 sccm, and the gap was 50 mm. As the Ar carrier gas flow rate was increased from 50 sccm to 150 sccm, the TaN deposition rate increased from about 60 Å/min to about 140 Å/min, the sheet resistance uniformity increased from 9% at 50 sccm to 26% at 150 sccm, and the volume resistivity decreased from about 4,000 $\mu\Omega$-cm to about 2,000 $\mu\Omega$-cm, respectively.

Figure 5B:
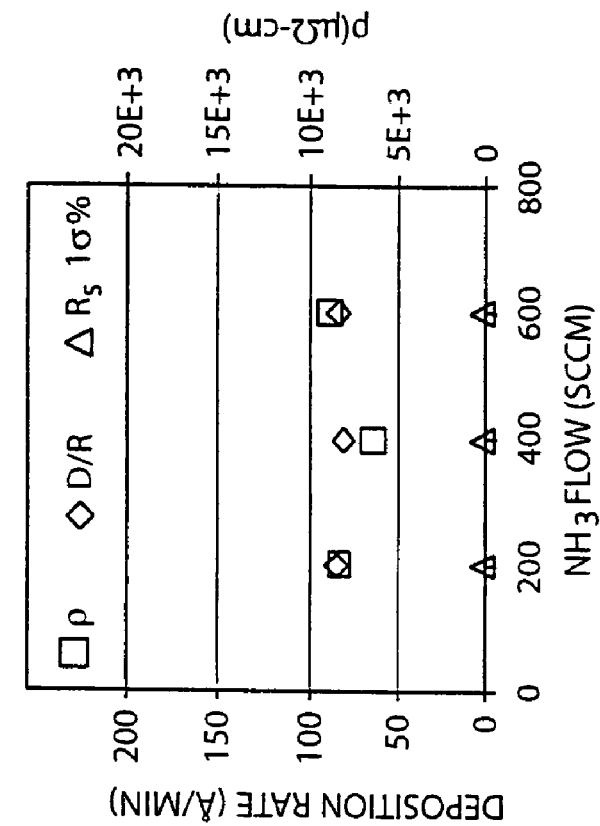
FIGS. 5A–5C show formation of TaN layers from a process gas containing TAIMATA precursor gas according to embodiments of the invention.
Figure 5A:
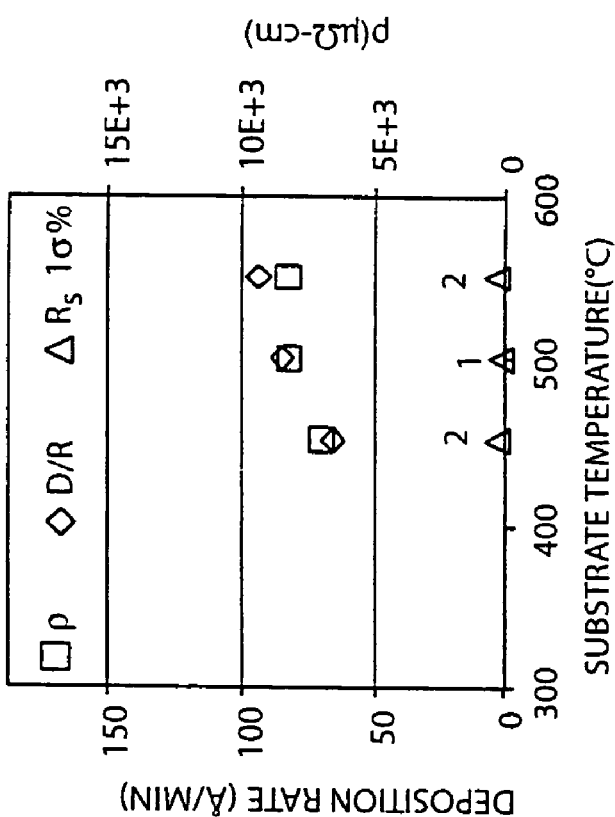
Figure 5C:
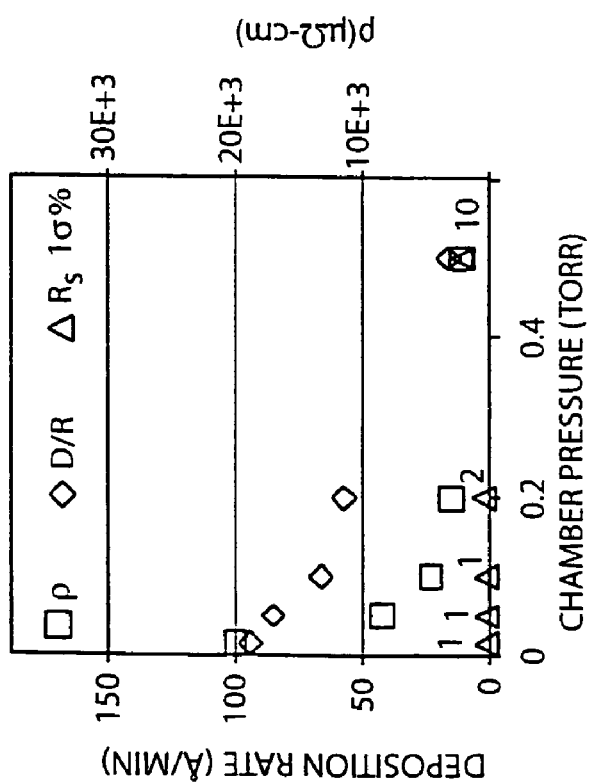

FIGS. 5A–5C show formation of TaN layers from a process gas containing TAIMATA precursor gas according to embodiments of the invention. FIG. 5A is a graph showing deposition rate (D/R), sheet resistance uniformity ($R_s$), and volume resistivity ($\rho$) of TaN layers as function substrate temperature. The chamber pressure was 0.05 Torr, the Ar dilution gas flow rate was 20 sccm, the Ar carrier gas flow rate was 100 sccm, and the gap was 50 mm. As the substrate temperature was increased from 450° C. to 550° C., the TaN deposition rate increased from about 70 Å/min to about 95 Å/min, the sheet resistance uniformity was about 1% to 2%, and the volume resistivity increased from about 7,000 μΩ-cm to about 8,000 μΩ-cm, respectively. In summary, good sheet resistance uniformity was observed as the deposition rate and the volume resistivity increased with increasing substrate temperature.

FIG. 5B is a graph showing deposition rate (D/R), sheet resistance uniformity ($R_s$), and volume resistivity ($\rho$) of TaN layers as function of $NH_3$ flow. The Ar dilution gas flow rate was 20 sccm, the Ar carrier gas flow rate was 100 sccm, the substrate temperature was 500° C., the chamber pressure was 0.05 Torr, and the gap was 50 mm. As the $NH_3$ flow rate was increased from 200 sccm to 600 sccm, the TaN deposition rate was between about 80 Å/min and about 90 Å/min, the sheet resistance uniformity was about 1% to 2%, and the volume resistivity increased from about 6,000 μΩ-cm to about 9,000 μΩ-cm, respectively. In summary, good sheet resistance uniformity was observed as the deposition rate and the volume resistivity decreased with increasing $NH_3$ flow rate.

FIG. 5C is a graph showing deposition rate, sheet resistance uniformity, and electrical resistivity TaN layers as function of chamber pressure. The Ar dilution gas flow rate was 20 sccm, the Ar carrier gas flow rate was 100 sccm, the $NH_3$ flow rate was 200 sccm, the substrate temperature was 500° C. and the gap was 50 mm. As the chamber pressure was increased from 0.01 Torr to 0.5 Torr, the TaN deposition rate decreased from about 90 Å/min to about 20 Å/min, the sheet resistance uniformity increased from 1% to 10%, and the volume resistivity decreased from about 20,000 μΩ-cm to about 2,000 μΩ-cm, respectively. In summary, good sheet resistance uniformity was observed as the deposition rate and the volume resistivity decreased with increasing chamber pressure.

Figure 6A:
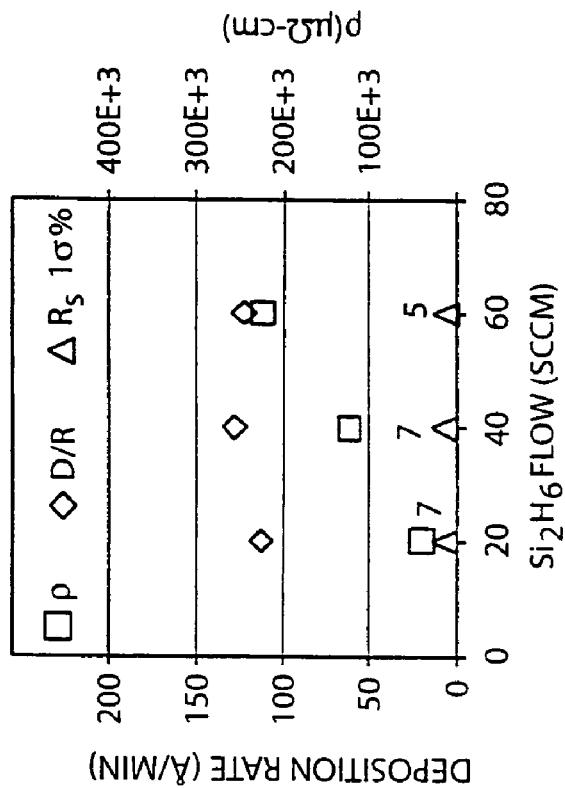
FIGS. 6A–6C show formation of TaSiN layers from a process gas containing TAIMATA precursor gas and a silicon-containing gas according to embodiments of the invention.
Figure 6C:
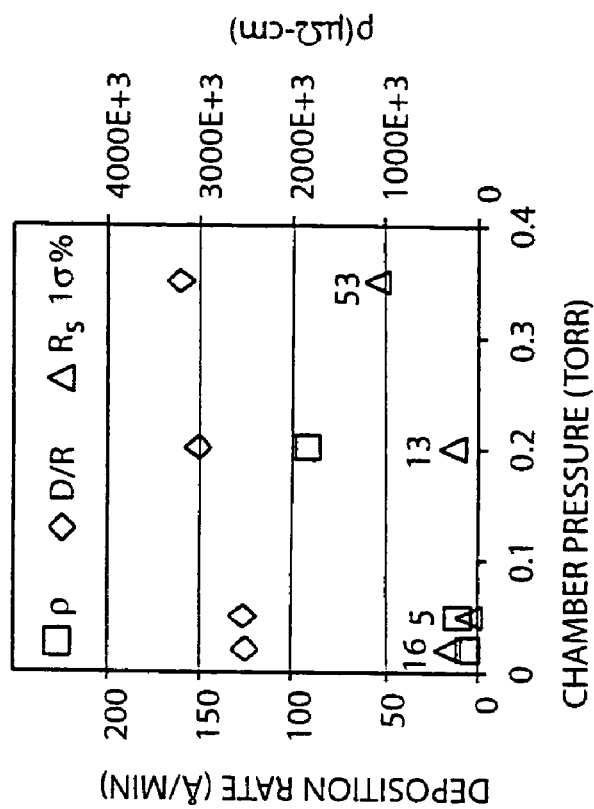

FIGS. 6–6C show formation of TaSiN layers from a process gas containing TAIMATA precursor gas and a silicon-containing gas according to embodiments of the invention. FIG. 6A is a graph showing deposition rate (D/R), sheet resistance uniformity ($R_s$), and volume resistivity ($\rho$) of TaSiN layers as a function of $Si_2H_6$ flow. The Ar dilution gas flow rate was 20 sccm, the Ar carrier gas flow rate was 100 sccm, the $NH_3$ flow rate was 200 sccm, the substrate temperature was 500° C., the chamber pressure was 0.05 Torr, and the gap was 50 mm. As the $Si_2H_6$ flow rate was increased from 20 sccm to 60 sccm, the TaSiN deposition rate was about 120 Å/min to about 130 Å/min, the sheet resistance uniformity was between 5% and 7%, and the volume resistivity increased from about 40,000 μΩ-cm to about 230,000 μΩ-cm, respectively. In summary, good sheet resistance uniformity was observed as the volume resistivity increased with increasing $Si_2H_6$ flow.

Figure 6B:
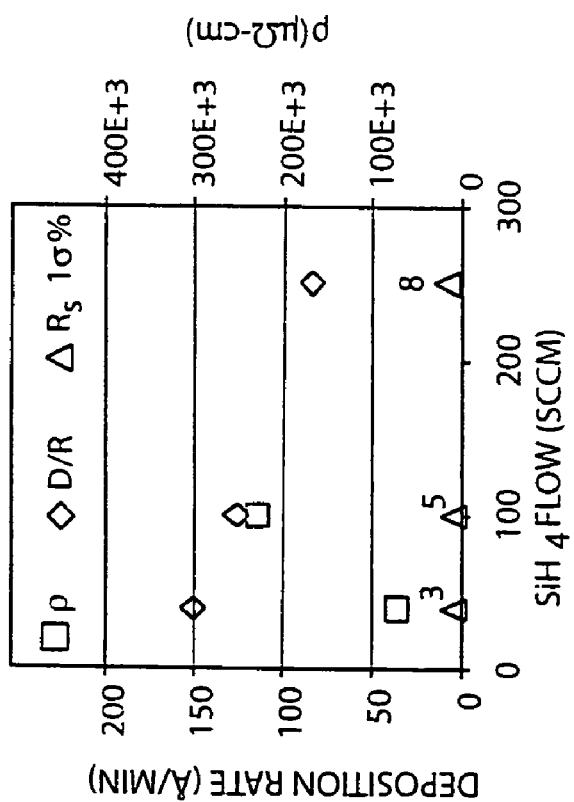

FIG. 6B is a graph showing deposition rate (D/R), sheet resistance uniformity ($R_s$), and volume resistivity ($\rho$) of TaSiN layers as a function of $SiH_4$ flow. The Ar dilution gas flow rate was 20 sccm, the Ar carrier gas flow rate was 100 sccm, the $NH_3$ flow rate was 200 sccm, the substrate temperature was 500° C., the chamber pressure was 0.05 Torr, and the gap was 50 mm. As the $SiH_4$ flow rate was increased from 40 sccm to 250 sccm, the TaSiN deposition rate decreased from about 150 Å/min to about 80 Å/min, and the sheet resistance uniformity increased from 5% to 7%. As the $SiH_4$ flow was increased from 40 sccm to 120 sccm, the volume resistivity increased from about 80,000 μΩ-cm to about 230,000 μΩ-cm, respectively. In summary, good sheet resistance uniformity was observed as the deposition rate decreased and the volume resistivity increased with increasing $Si_2H_6$ flow.

FIG. 6C is a graph showing deposition rate (D/R), sheet resistance uniformity ($R_s$), and volume resistivity ($\rho$) of TaSiN layers as a function of chamber pressure. The Ar dilution gas flow rate was 20 sccm, the Ar carrier gas flow rate was 100 sccm, the $NH_3$ flow rate was 200 sccm, the substrate temperature was 500° C., the $SiH_4$ flow rate was 100 sccm, and the gap was 50 mm. As the chamber pressure was increased from 0.01 Torr to 0.35 Torr, the TaSiN deposition rate increased from about 130 Å/min to about 160 Å/min. The sheet resistance uniformity initially decreased from 16% at 0.02 Torr to 5% at 0.05 Torr and then increased to 53% at 0.35 Torr. As the chamber pressure was increased from 0.01 Torr to 0.2 Torr, the volume resistivity increased from about 100,000 μΩ-cm to about 1,900,000 μΩ-cm, respectively. In summary, the TaSiN deposition rate and the volume resistivity increased with increasing chamber pressure, and good sheet resistance uniformity was observed at a chamber pressure of about 0.05 Torr.

Figure 7:
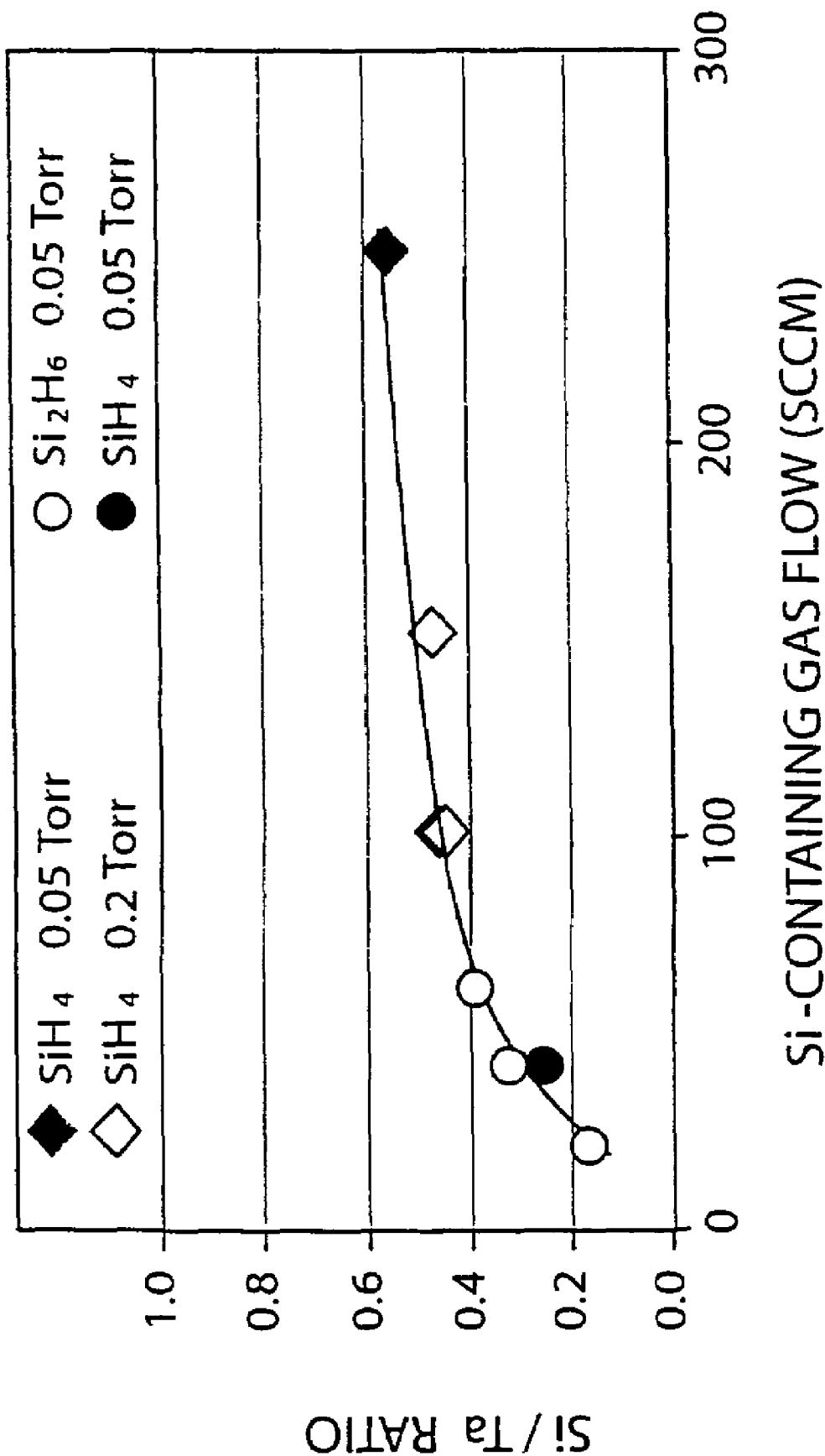
FIG. 7 shows Si/Ta ratio in TaSiN layers formed from a process gas containing TAIMATA precursor gas and a silicon-containing gas according to embodiments of the invention.

FIG. 7 is a graph showing the Si/Ta ratio in TaSiN layers formed from a process gas containing a TAIMATA precursor gas and a silicon-containing gas according to embodiments of the invention. The Si-containing gas was selected from $SiH_4$ and $Si_2H_6$. The Ar dilution gas flow rate was 20 sccm, the Ar carrier gas flow rate was 100 sccm, the $NH_3$ flow rate was 200 sccm, the substrate temperature was 500° C., and the gap was 50 mm. In FIG. 7, the Si/Ta ratio was determined using X-ray Photoelectron Spectroscopy (XPS) and was found to vary from about 0.15 to about 0.55 for the process conditions shown.

Figure 8:
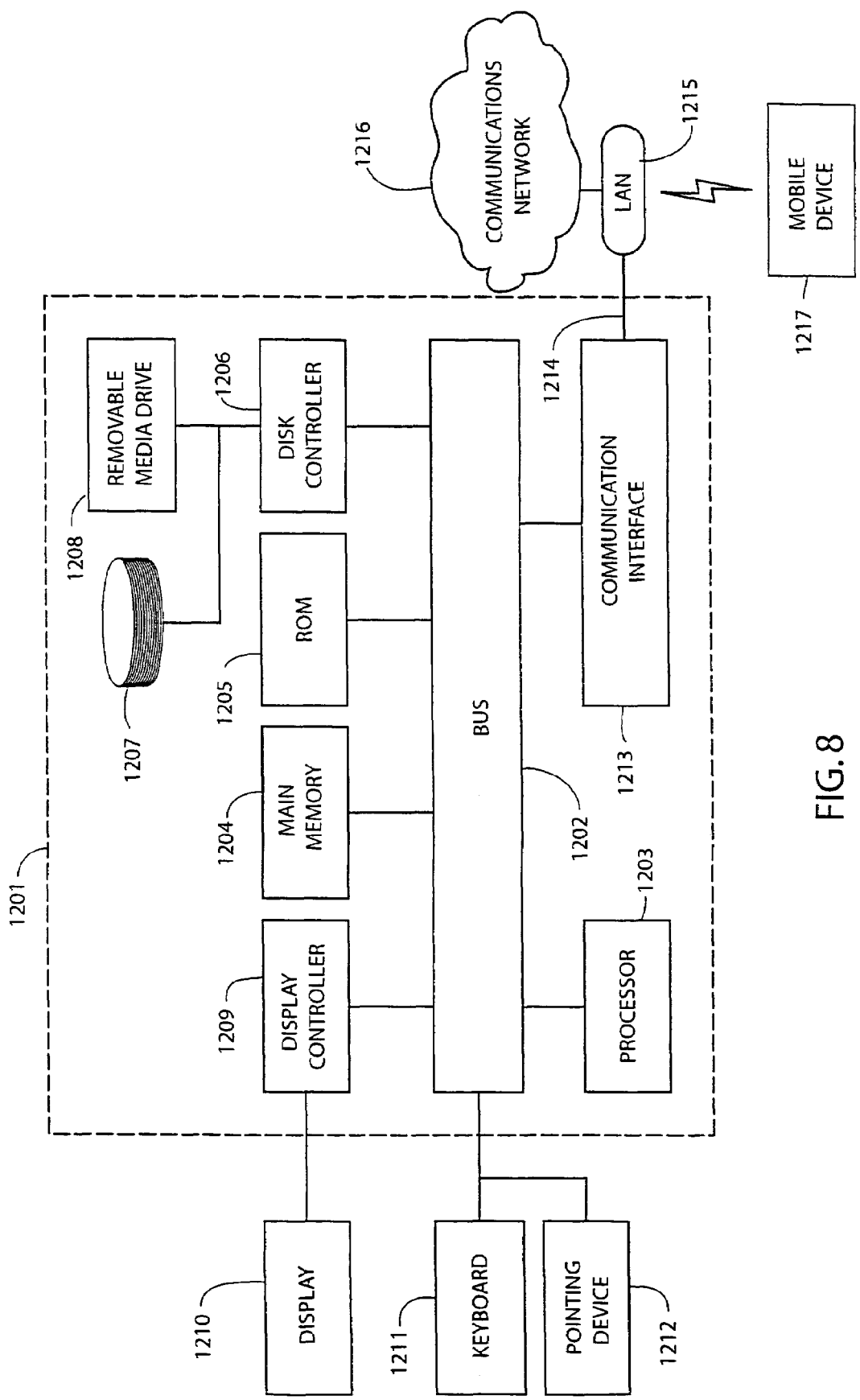
FIG. 8 shows a general purpose computer which may be used to implement the present invention.

FIG. 8 illustrates a computer system 1201 with which an embodiment of the present invention may be implemented. The computer system 1201 may be used as the controller 500, 240 of FIG. 1A or 1B, respectively, or a similar controller that may be used with the systems of these figures to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)), (not shown). The computer system may also include one or more digital signal processors (DSPs) (not shown), such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer (not shown) may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

The computer system 1201 may be configured to perform the method of the present invention to fabricate a tantalum-containing gate electrode structure having a tantalum-containing layer on a high-k dielectric layer. In accordance with the present invention, the computer system 1201 may be configured to form a tantalum-containing layer from a process gas containing TAIMATA precursor gas in a thermal chemical vapor deposition process.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a tantalum-containing gate electrode structure, the method comprising:
   providing a substrate having a high-k dielectric layer thereon in a process chamber; and
   forming a tantalum-containing layer on the high-k dielectric layer in a thermal chemical vapor deposition process by exposing the substrate in the process chamber to a first process gas containing TAIMATA precursor gas.

2. The method according to claim 1, wherein the tantalum-containing layer is a TaSiN layer formed on the high-k dielectric layer, and the first process gas containing TAIMATA precursor gas further contains a silicon-containing gas.

3. The method according to claim 2, wherein the silicon-containing gas flow rate is less than about 500 sccm.

4. The method according to claim 2, wherein the silicon-containing gas comprises silane ($SiH_4$), disilane ($Si_2H_6$), dichlorosilane ($SiH_2Cl_2$), hexachlorodisilane ($Si_2Cl_6$), bis (tertbutylamino) silane ($SiH_2(NBu^t)_2$), or tetrakis (dimethylamino) silane ($Si(NMe_2)_4$) or a combination of two or more thereof.

5. The method according to claim 2, wherein the first process gas further comprises a nitrogen-containing gas.

6. The method according to claim 5, wherein the nitrogen-containing gas flow rate is less than about 1,000 sccm.

7. The method according to claim 5, wherein the nitrogen-containing gas comprises $NH_3$.

8. The method according to claim 2, further comprising forming a tungsten (W) layer on the TaSiN layer.

9. The method according to claim 8, wherein the forming a W layer comprises exposing the substrate to a second process gas containing $W(CO)_6$, $WF_6$, or $WCl_6$ or a combination of two or more thereof.

10. The method according to claim 2, further comprising forming a TaN layer on the TaSiN layer in a thermal chemical vapor deposition process by exposing the substrate in the process chamber to a second process gas containing TAIMATA precursor gas.

11. The method according to claim 10, wherein the second process gas further comprises a nitrogen-containing gas.

12. The method according to claim 11, wherein the nitrogen-containing gas flow rate is less than about 1,000 sccm.

13. The method according to claim 11, wherein the nitrogen-containing gas comprises $NH_3$.

14. The method according to claim 1, wherein the first process gas flow rate into the process chamber is less than about 2,000 sccm.

15. The method according to claim 1, wherein the first process gas further comprises a carrier gas or a dilution gas or a combination thereof.

16. The method according to claim 15, wherein one or both of the carrier gas and the dilution gas contain Ar or He.

17. The method according to claim 1, wherein the first process gas further comprises $H_2$.

18. The method according to claim 1, wherein the forming occurs at a process chamber pressure between about 1 mTorr and about 1,000 mTorr.

19. The method according to claim 1, wherein the forming occurs at a process chamber pressure between about 10 mTorr and about 200 mTorr.

20. The method according to claim 1, wherein the forming further comprises heating the substrate to between about 250° C. and about 750° C.

21. The method according to claim 1, wherein the forming further comprises heating the substrate to between about 400° C. and about 600° C.

22. A method of forming a tantalum-containing gate electrode structure, the method comprising:
   providing a substrate having a high-k dielectric layer thereon to a process chamber; and
   forming a TaSiN layer on the high-k dielectric layer in a thermal chemical vapor deposition process by heating the substrate to between about 250° C. and about 750° C. and exposing the heated substrate in the process chamber to a first process gas containing TAIMATA precursor gas and a silicon-containing gas.

23. The method according to claim 22, wherein the silicon-containing gas comprises silane ($SiH_4$), disilane ($Si_2H_6$), dichlorosilane ($SiH_2Cl_2$), hexachlorodisilane ($Si_2Cl_6$), bis (tertbutylamino) silane ($SiH_2(NBu^t)_2$), or tetrakis (dimethylamino) silane ($Si(NMe_2)_4$) or a combination of two or more thereof.

24. The method according to claim 22, wherein the first process gas further comprises $NH_3$.

25. The method according to claim 22, further comprising forming a tungsten (W) layer on the TaSiN layer.

26. The method according to claim 25, wherein the forming a W layer comprises exposing the substrate to a second process gas containing $W(CO)_6$, $WF_6$, or $WCl_6$ or a combination of two or more thereof.

27. The method according to claim 22, further comprising forming a TaN layer on the TaSiN layer in a thermal chemical vapor deposition process by exposing the substrate in the process chamber to a second process gas containing TAIMATA precursor gas.

28. The method according to claim 27, wherein the second process gas further comprises $NH_3$.

29. The method according to claim 22, wherein the first process gas further comprises a carrier gas or a dilution gas or a combination thereof.

30. The method according to claim 29, wherein one or both of the carrier gas and the dilution gas contain Ar or He.

31. The method according to claim 22, wherein the forming further comprises heating the substrate to between about 400° C. and about 600° C.

* * * * *

UNITED STATES PATENT AND TRADEMARK OFFICE
CERTIFICATE OF CORRECTION

PATENT NO. : 7,067,422 B2
APPLICATION NO. : 10/830804
DATED : June 27, 2006
INVENTOR(S) : Nakamura et al.

It is certified that error appears in the above-identified patent and that said Letters Patent is hereby corrected as shown below:

Column 3, line 1, "compartment 1O$d$." should read --compartment 10$d$.--.
Column 7, line 37, "FIGS. 6-6C" should read --FIGS. 6A-6C--.
Column 11, line 4, "maybe" should read --may be--.
Column 11, line 23, "(PDA) laptop" should read --(PDA), laptop--.

Signed and Sealed this

Second Day of December, 2008

JON W. DUDAS
*Director of the United States Patent and Trademark Office*